Figure 1:
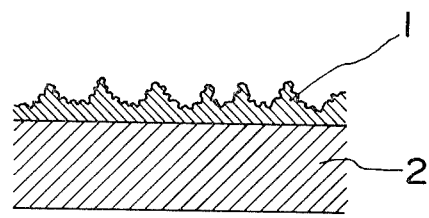

United States Patent [19]

Iwasaki et al.

[11] 4,216,246
[45] Aug. 5, 1980

[54] METHOD OF IMPROVING ADHESION BETWEEN INSULATING SUBSTRATES AND METAL DEPOSITS ELECTROLESSLY PLATED THEREON, AND METHOD OF MAKING ADDITIVE PRINTED CIRCUIT BOARDS

[75] Inventors: Yorio Iwasaki; Toshiro Okamura, both of Shimodate; Akishi Nakaso, Oyama; Nobuo Uozu, Shimodate; Hiroshi Takahashi, Kasama, all of Japan

[73] Assignee: Hitachi Chemical Company, Ltd., Tokyo, Japan

[21] Appl. No.: 905,398

[22] Filed: May 12, 1978

[30] Foreign Application Priority Data

May 14, 1977 [JP] Japan .................. 52-55789
May 14, 1977 [JP] Japan .................. 52-55790

[51] Int. Cl.² .............................. B05D 3/06
[52] U.S. Cl. ................... 427/43.1; 427/96; 427/98; 427/270; 427/304; 427/305; 427/306; 427/307; 427/340; 427/404; 156/668; 430/275; 430/281; 430/319
[58] Field of Search ............ 427/96, 97, 270, 340, 427/307, 304–306, 404, 407 R, 43, 98; 156/668

[56] References Cited

U.S. PATENT DOCUMENTS

| 3,226,256 | 12/1965 | Schneble et al. ............ 427/98 |
| 3,466,232 | 9/1969 | Francis et al. ............ 427/307 |
| 3,672,937 | 6/1972 | Kallrath et al. ............ 427/307 |
| 3,672,938 | 6/1972 | Zeblisky ............ 427/97 |
| 3,686,359 | 8/1972 | Soldatas et al. ............ 260/836 |
| 3,698,940 | 10/1972 | Merserego et al. ............ 428/209 |
| 3,730,757 | 5/1973 | Knorre ............ 427/307 |
| 3,758,304 | 9/1973 | Janssen et al. ............ 96/38.4 |
| 3,772,078 | 11/1973 | Polichette et al. ............ 427/36 |
| 3,925,138 | 12/1975 | Shaul et al. ............ 427/307 |
| 4,001,466 | 1/1977 | Shaol et al. ............ 427/96 |

*Primary Examiner*—Michael F. Esposito
*Assistant Examiner*—Janyce A. Bell
*Attorney, Agent, or Firm*—Armstrong, Nikaido, Marmelstein & Kubovcik

[57] ABSTRACT

A method of improving adhesion between the surface of a substrate and a metal deposit electrolessly plated thereon by forming a novel adhesive material layer comprising (A) a rubber material and (B) a thermosetting resin which is present in a proportion defined by the formula $20 \leq (B)/(A)+(B) \leq 85$ volume %. In the adhesive layer the thermosetting resin is dispersed, in the form of substantially spherical particles of 0.5 to 15μ, in the continuous phase of the rubber material. The method is useful for producing printed circuit boards having a high precision and high accuracy pattern circuit. Further, the method is extremely advantageous when it is applied to the so-called photo-forming process since disappearance of the catalyst nuclei on the circuit pattern image can be eliminated.

6 Claims, 2 Drawing Figures

METHOD OF IMPROVING ADHESION BETWEEN INSULATING SUBSTRATES AND METAL DEPOSITS ELECTROLESSLY PLATED THEREON, AND METHOD OF MAKING ADDITIVE PRINTED CIRCUIT BOARDS

This invention relates to a method of rendering the surface of an insulating substrate adhesive to a metal deposit electrolessly plated thereon. More particularly, the present invention is concerned with a method of improving adhesion between the surface of an insulating substrate and a metal deposit electrolessly plated thereon by forming on the substrate surface a layer of an adhesive material having a specific composition and a specific structure. The present invention is also concerned with a method of making a printed circuit board by the additive process which board has excellent characteristics obtained through the formation of a layer of the above-mentioned specific adhesive material on the substrate surface.

The printed circuit boards have advantageously been widely employed for reducing the manufacturing cost of various electronic apparatuses and equipments and improving performance and reliability of such apparatuses and equipments. Accordingly, the manufacturing techniques and materials used therefor have made a progress.

The conventional methods which have most commonly been employed for making printed circuit boards in the art are the "etched foil" process. This conventional "etched foil" process consists in etching the copper foil of a copper clad substrate to form a desired pattern circuit and electrodepositing copper onto the inner walls of the through-hole portions using a copper pyrophosphate type electroplating solution capable of giving a copper deposit having excellent uniform adherence. However, the "etched foil" process has such an inherent disadvantage that the copper foil laminate is necessarily etched away from the portions except the circuit portions. For the purpose of obviating such a disadvantage as is unavoidable in the "etched foil" process as well as facilitating connection between the circuits on the both sides of the substrate by means of through-holes, there has been developed the "additive" process which is characterized by forming conductor circuit portions utilizing electroless metal plating.

The additive process as mentioned above is classified into the following processes (I) and (II).

The process (I) consists in the steps of:
(1) forming through-holes in an insulating substrate;
(2) applying catalyst nuclei onto the whole surface of the substrate (this step may be omitted when there is employed a substrate in which catalyst nuclei are incorporated);
(3) electrolessly plating an initial thin conductor metal deposit (about 1 to 10μ) over the whole surface of the substrate;
(4) applying onto the electrolessly plated surface of the substrate a masking resist to form a negative image of the desired circuit pattern;
(5) electroplating the nonmasked portions of the initial conductor metal deposit with an additional conductor metal to build up the conductor portions of the circuit to a desired total thickness (about 30 to 50μ);
(6) stripping the masking resist from the noncircuit portions of the surface; and
(7) etching away all of the initial thin electroless metal deposit from the stripped portions.

The process (II) consists in the steps of:
(1) forming through-holes in an insulating substrate;
(2) (i) applying catalyst nuclei onto the whole surface of the substrate (this step may be omitted where there is employed a substrate in which catalyst nuclei are incorporated) and applying onto the sensitized surface of the substrate a masking resist to form a negative image of the desired circuit pattern; or
(ii) applying catalyst nuclei onto the substrate surface at a preselected circuit pattern portions thereof to restrict the sensitized surface to the preselected circuit pattern portions; and
(3) electrolessly plating the sensitized circuit pattern portions of the substrate surface with a conductor metal to build up the conductor portions of the circuit to a desired thickness (about 30 to 50μ).

The above-mentioned additive process is disclosed in, for example, U.S. Pat. No. 3,698,940, and particularly, the process (I) and the process (II) correspond to FIG. 1 and FIG. 2 of U.S. Pat. No. 3,698,940, respectively.

In the additive process, however, there is encountered the difficulty in stably obtaining sufficient adherence of the substrate to the conductor metal electrolessly deposited thereon, leading to poor mechanical strength of the printed circuit board. In order to solve such a problem, it is usually practiced to use adhesives as an intermediate for bonding a conductor metal to a substrate, and there have heretofore been proposed various kinds of the adhesives. But, any of the conventionally proposed adhesives is still insufficient in adhesion between the substrate and the conductor metal, so that it is difficult to obtain printed circuit boards having a high mechanical strength as well as a high precision and high accuracy pattern circuit.

Accordingly, it is an object of the present invention to provide a method of improving adhesion between an insulating substrate and a metal deposit electrolessly plated thereon.

It is another object of the present invention to provide a method of making a printed circuit board which is excellent in mechanical strength, particularly in adhesion between the substrate and the conductor metal deposited thereon.

It is still another object of the present invention to provide a method of making a printed circuit board having a high precision and high accuracy pattern circuit.

Figure 2:
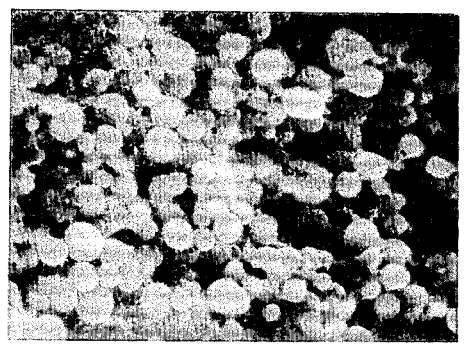

The foregoing and other objects, features and advantages of the present invention will be apparent to those skilled in the art from the following detailed description taken in connection with the accompanying drawing in which:

FIG. 1 is a diagrammatic view illustrating an enlarged cross-section of a conventional adhesive material layer; and FIG. 2 is a plan view of the microphotograph ($\times 1,300$) of the adhesive material layer formed according to the method of the present invention, showing substantially spherical particles of the component (B) which appear in the surface of the adhesive material layer.

In one aspect of the present invention, there is provided a method of rendering the surface of an insulating substrate adhesive to a metal deposit electrolessly plated thereon which comprises the steps of:

(1) forming on the surface of an insulating substrate a layer of an adhesive material comprising (A) a rubber material selected from the group consisting of an acrylonitrile-butadiene copolymer, a polychloroprene, a polybutadiene and mixtures thereof and (B) a thermosetting resin selected from the group consisting of a bisphenol A type epoxy resin, a novolak type epoxy resin, an alicyclic glycidyl ether resin, a resol type phenolic resin, a novolak type phenolic resin, an alkylphenolic resin and mixtures thereof, the component (B) being dispersed, in the form of substantially spherical particles having a particle diameter of 0.5 to 15μ, in a continuous phase of the component (A) and present in a proportion defined by the formula $20 \leq (B)/(A)+(B) \leq 85\%$ by volume;

(2) subjecting the adhesive material to heat-curing treatment; and (3) treating the layer surface of the heat-curing treated adhesive material with an oxidizing agent to effect etching whereby the heat-cured particles of the component (B) appear in the surface of said adhesive material layer;

the oxidizing agent-treated layer surface being sensitized for electroless plating by incorporating catalyst nuclei in the adhesive material employed in the step (1) or applying catalyst nuclei onto said oxidizing agent-treated layer surface after the step (3).

Referring to FIG. 1 showing a diagrammatic illustration of an enlarged cross-section of a conventional adhesive material layer to be used for electrolessly plating a conductor metal thereon. In FIG. 1, numeral 1 designates the adhesive material layer with its surface coarsened by etching, and numeral 2 designates a substrate having the adhesive material layer formed thereon. As the adhesive material used for forming such a conventional adhesive material layer, there is known, for example, a resin composition comprising a phenolic resin (e.g. about 40 volume percent) and acrylonitrile-butadiene copolymer (e.g. about 60 volume percent), said phenolic resin being dispersed, in the from of particles having a diameter as small as about 0.1μ or less, uniformly in the acrylonitrile-butadiene copolymer. When such conventional adhesive material is, after heat-cured, subjected to etching treatment, the phenolic resin component is etched away together with the acrylonitrile-butadiene copolymer to form the coarsened surface having a wavy structure in cross-section. Such coarsened surface area defined by the wavy structure is still insufficient for attaining excellent adhesion between the adhesive material layer and the conductor metal deposit electrolessly plated thereon. The surface, even coarsened, of the conventional adhesive material layer has other disadvantages as will be mentioned later.

Referring now to FIG. 2 showing a plan view of the microphotograph ($\times 1,300$) of the adhesive material layer formed according to the method of the present invention, the microphotograph was taken by a scanning electron microphotographic apparatus. As is clearly seen from FIG. 2, the heat-cured component (B) of a specific thermosetting resin appears, in the form of substantially spherical particles having a particle diameter of 0.5 to 15μ, in the surface of the adhesive material layer, leaving void spaces from which the heat-cured component (A) of a rubber material has been etched away. With such a specific structure of the coarsened surface of the adhesive material layer obtained according to the method of the present invention, the adhesive surface area is remarkably increased to improve adhesion between the adhesive material layer and the conductor metal deposit electrolessly plated thereon.

As apparent from the above, the adhesive material to be employed in the method of the present invention consists essentially of a component (A) which forms a continuous phase in the adhesive material and is capable of being dissolved away by etching and a component (B) which is dispersed in said continuous phase of the component (A) in the form of particles having a particle diameter of 0.5 to 15μ.

For attaining the specific state of the adhesive material that the component (B) is dispersed, in the form of particles having a particle diameter of 0.5 to 15μ, in the continuous phase of the component (A), it is requisite that the component (B) be present in a proportion defined by the formula $20 \leq (B)/(A)+(B) \leq 85\%$ by volume and that the component (B) has an SP value 1 to 4 higher than that of the component (A).

When the amount of the component (B) is less than 20% by volume based on the total amount of the components (A) and (B), the component (B) is dispersed, in the form of substantially spherical particles having a particle diameter of less than 0.5μ, in the component (A) so that the etching cannot provide a desired coarsened surface having a sufficient adhesion to a conductor metal deposit electrolessly plated thereon. On the other hand, when the amount of the component (B) is more than 85% by volume based on the total amount of the components (A) and (B), the components (A) and (B) tend to be separated into the respective two layers so that there cannot be formed substantially spherical particles of the component (B).

According to desired kind and/or characteristics of printed circuit boards to be made utilizing such an adhesive material, it is sometimes desired to further control particle diameters of the particles of the component (B) within the range of 0.5 to 15μ. Such a control can be effected by appropriately choosing a method of applying energy for dispersion (method of mixing), a kind of a solvent to be used for preparing a liquid of the adhesive material, a molecular weight of the component (B) and/or the like.

As the rubber materials to be used as the component (A) which forms a continuous phase and is capable of being dissolved away by etching, there can be mentioned an acrylonitrile-butadiene copolymer (SP value: about 8.8 to 9.9), a polychloroprene (SP value: 9.2 to 9.3) and a polybutadiene (SP value: about 8.4 to 8.6). Illustrative examples of acrylonitrile-butadiene copolymers include N-1001 [acrylonitrile content (AN): 41%], N-1032 (AN: 33%), N-DN401 (AN: 19%) and H-1000$\times$132 (AN: 51%) which are all trade names of products of Nihon Zeon K.K., Japan). Examples of polychloroprenes include NEOPRENE AD, NEOPRENE GN and NEOPRENE W which are all trade names of products of Shows Neoprene K.K., Japan). Examples of polybutadienes include N-BR-1220 and N-BR-1441 which are all trade names of products of Nihon Zeon K.K., Japan). The above-mentioned rubber materials may be employed alone or in mixture. Further, they may be employed in combination with other rubber materials such as a styrene-butadiene copolymer as far as the desired properties of the component (A) are not impaired.

As an etching agent to be used for dissolving away the component (A) from the adhesive material layer by etching, there can be mentioned aqueous solutions of the systems: chromic acid-sulfuric acid ($CrO_3$ 20–200 g/liter; conc. H$_2$SO$_4$ 100–500 ml/liter), potassium dichromate—borofluoric acid (K$_2$Cr$_2$O$_7$ 20–100 g/liter; 42 to 45% HBF$_4$ 500–900 ml/liter) and the like.

As thermosetting resins to be used as the component (B) which is to be dispersed, in the form of substantially spherical particles, in the continuous phase of the component (A), there can be mentioned an epoxy resin selected from the group consisting of a bisphenol A type opoxy resin (SP value: about 9.0 to 12.0), a novolak type epoxy resin (SP value: about 8.5 to 9.5) and an alicyclic glycidyl ether resin (SP value: about 8.0 to 9.5); and a phenolic resin (SP value: about 9.5 to 11.5) selected from the group consisting of a resol type phenolic resin, a novolak type phenolic resin and an alkyl phenolic resin. The above-mentioned thermosetting resins may be employed alone or in mixture. Further, they may be employed in combination with other thermosetting resins such as a urea resin, a melamine resin, a polyester resin and the like as far as the desired properties of the component (B) are not impaired. Illustrative examples of bisphenol A type epoxy resins include EPIKOTE 1004, 1002, 1001, 836 and 834 which are trade names of products of Shell Chemical. Examples of novolak type epoxy resins include EPIKOTE 154 and 152 which are trade names of products of Shell Chemical. Examples of alicyclic glycidyl ether resins include CHISSONOX 206, 221 and 289 which are trade names of products of Chisso K.K., Japan. Examples of novolak type phenolic resins are SP6600 (trade name of a product of Schenectady Chemical Corp., U.S.A.), HP-607N (trade name of a product of Hitachi Chemical Co. Ltd., Japan), PR-11078 (trade name of a product of Sumitomo Durez K.K., Japan) and the like. Examples of resol type phenolic resins are VP-13N (trade name of a product of Hitachi Chemical Co., Ltd., Japan) and the like. Examples of alkylphenolic resins are H-2400 (trade name of a product of Hitachi Chemical Co., Ltd., Japan) and the like.

In this connection, it is further noted that the suitable proportion of the component (B) should be chosen taking into consideration the SP value difference between the components (A) and (B) to be employed. Illustratively stated, when the incompatibility between the components (A) and (B) is large (i.e., the SP value difference is large, for example about more than 2 to 4), the proportion of the component (B) cannot be so large and is suitably about 20 to 60% by volume based on the total of the components (A) and (B) (e.g., in the case of combination of a certain kind of epoxy resin and a polybutadiene). On the other hand, when the incompatibility between the components (A) and (B) is small (i.e., the SP value difference is not so large, for example about 1 to 2), the proportion of the component (B) is necessarily large and suitably about 50 to 85% by volume based on the total of the components (A) and (B) (e.g., in the case of combination of a certain kind of epoxy resin or a phenolic resin and an acrylonitrile-butadiene copolymer).

The adhesive materials to be used in the method of the present invention are applied in the form of a liquid. The liquid of the adhesive material may be prepared, for example, by employing (i) a method in which the rubber material as the component (A) and the thermosetting resin as the component (B) are mixed with a good solvent for both of the components (A) and (B), followed by agitation, or (ii) a method in which the components (A) and (B) are separately mixed with respective good solvents therefor and the two resulting solutions are combined, followed by agitation. In the so prepared liquid of the adhesive material obtained through the sufficient agitation, the component (B) is dispersed, in the state dissolved in the solvent used therefor, in the continuous phase of the component (A) dissolved in the solvent used therefor. Examples of the solvents include methyl ethyl ketone, xylene, toluene, ethyl acetate, methyl acetate and methyl cellosolve. An amount of the solvent is not critical, and suitably determined taking into consideration the method of applying the resulting liquid of the adhesive material onto the surface of the substrate. Generally, there may be employed an amount as will provide an adhesive material liquid containing non-volatile matters in a proportion of 20 to 40% by weight based on the liquid.

The adhesive material may be applied onto the surface of an insulating substrate by ordinary techniques such as a dipping method, a certain flow method, a method in which the solution of the adhesive material is formed into a film by casting and the resulting film is attached onto the surface of the substrate, and the like. Upon evaporation of the solvent, there is formed an adhesive material layer on the surface of the substrate. In general, a thickness of the adhesive material layer may be 30 to 60$\mu$ on a dry basis.

The adhesive material of the thus formed layer on the surface of the substrate is subjected to heat-curing treatment. The heat-curing is effective in the following points. (i) In the subsequent etching step, unfavorable swelling of the adhesive material layer and running away of the substantially spherical particles of the component (B) can be eliminated; (ii) the adhesive material layer is not corroded with an electroless plating solution having a pH value of 12 to 13 and employed at 25 to 70° C.; and (iii) there can be obtained heat-resistance (resistance to a fused solder) and chemicals-resistance (resistance to cyanide, etc.) which are necessary properties for the printed circuit board to be produced as the final product. The conditions for the heat-curing treatment may vary depending on the kinds of the components (A) and (B) as well as the use of the printed circuit board to be finally produced. Generally, the heat-curing treatment may be effected by exposing the adhesive material to heated air, infrared rays, high frequency waves, ultrasonic waves or the like at about 130° to 180° C. for about 0.5 to 2 hours.

As described before, in the adhesive material to be employed in the method of the present invention, the component (B) is dispersed, in the form of substantially spherical particles having a particle diameter of 0.5 to 15$\mu$, in a continuous phase of the component (A). By treating the adhesive material with an etching agent (oxidizing agent), the component (A) is dissolved away whereas the component (B) remains undissolved and the substantially spherical particles of the component (B) appear in the surface of the adhesive material layer as seen in FIG. 2.

It is required for obtaining such as adhesive material as will provide the specific surface structure after etching that the component (A) be incompatible with the component (B). In general, as far as the component (A) is incompatible with the component (B), even when the components (A) and (B) are dissolved in a solvent, the components are separated to respective two layers or one component is dispersed in the other component. The mutual solubility or compatibility can be assessed using a "solubility parameter", which is used to assess the solubility of polymers in solvents, see the paper entitled "Solubility Parameter Values" by H. Burrell and B. Immergut in "Polymer Handbook" (1966) part IV, page 34 Onwards. When two polymers each have a similar SP value, they are mutually compatible. When the difference in SP value between two polymers is large, the polymers are not mutually compatible to form a dispersion. In the latter case, the polymer having a relatively large SP value is dispersed in the polymer having a relatively small SP value. In the method of the present invention, the thermosetting resin employed as the component (B) has an SP value larger than that of the rubber material employed as the component (A).

In the mixed system of the component (A), the component (B) and a solvent therefor, since the system is inherently unstable, as the proportion of the component (B) is increased and the concentration of the particles is increased, the particles are brought into collision with one another to be merged into particles having an increased diameter. Differently stated, the increase of a relative volume occupied by the component (B) in the mixed system occurs concurrently with the increase in diameter of the formed particles. However, in any way, according to this invention, the present adhesive material can be obtained by employing the components (A) and (B) in a proportion defined by the formula $20 \leq (B)/(A)+(B) \leq 85\%$ by volume, said component (B) having an SP value 1 to 4 higher than that of said component (A). For example, when a mixture of an acrylonitrilebutadiene copolymer having 18 to 45% AN and an SP value of 9.2 to 9.5 [as the component (A)], a bisphenol A type epoxy resin having a weight average molecular weight of about 500 to 1,500 and an SP value of 11 to 12 [as the component (B)] and additives such as a vulcanizer, a curing agent, etc., the component (B) being employed in a proportion defined by the formula $20 \leq (B)/(A)+(B) \leq 85\%$ by volume, are dissolved in methyl ethyl ketone and agitated, there is obtained an adhesive material composition in which the component (B) is dispersed in the form of substantially spherical particles having a diameter of about 1 to $10\mu$.

The molecular weights of the component (A) and the component (B) to be employed for producing the present adhesive material are not critical. In general, with respect to the component (B), the weight average molecular weights of the bisphenol A type epoxy resins, the novolak type epoxy resins and the alicyclic glycidyl ether resins are about 450 to 4,000, about 300 to 700 and about 135 to 600, respectively. The weight average molecular weights of the resol type phenolic resins, the novolak type phenolic resins and the alkylphenolic resins (of which the alkyl moiety is a straight chain or branched alkyl having 4 to 9 carbon atoms) are generally in the range of about 200 to 2,000.

As described, according to the present invention, there is employed a specific adhesive material in which the component (B) having a 1 to 4 higher SP value relative to that of the component (A) is dispersed in the form of substantially spherical particles having a diameter as large as 0.5 to $15\mu$. In such a specific adhesive material composition, the particle size is large and the distribution density of the particles is high as compared with those in the conventional adhesive material composition. By the use of the layer of such an adhesive material having a specific composition as well as a specific structure, there can be attained excellent adhesion between the substrate and the conductor metal deposit electrolessly plated thereon. When such an adhesive material layer is cured by heating and coarsened by etching (using an oxidizing agent), the heat-cured spherical particles having a diameter of 0.5 to $15\mu$ appear in the surface of the adhesive material layer. When the particle diameter is smaller than $0.5\mu$, the component (B) tends to be removed simultaneously with etching away of the component (A) in the etching step. On the other hand, when the particle size is larger than $15\mu$, there cannot be obtained a adhesive surface area sufficient for firmly bonding thereto a conductor metal deposit electrolessly plated thereon. In both the cases, there cannot be obtained a high peel strength. The particle diameter may be visually measured using a microphotograph.

Taking as an example of the adhesive material a composition comprising an acrylonitritre-butadiene copolymer [as the component (a)] and a bisphenol A type epoxy resin [as the component (B)], an illustrative explanation will be given on the method of the present invention. For example, the method comprises:

(1) adding into methyl ethyl ketone 100 parts by weight of a bisphenol A type epoxy resin as the thermosetting resin [component (B)] and 40 to 100 parts by weight of an acrylonitrile-butadiene copolymer as the rubber material [component (A)], followed by mixing;

(2) adding 10 to 20 parts by weight of zinc oxide as a filler;

(3) adding 3 to 4 parts by weight of dicyandiamide as a curing agent for the epoxy resin;

(4) applying the thus prepared adhesive material, by dipping, onto a fiber glass-reinforced epoxy resin type substrate at a dry thickness of about 30 to $60\mu$, followed by heat-curing treatment at 160° C. for 60 minutes; [the SP values of the employed epoxy resin and the employed rubber material are 11 and 9.5, respectively and the SP value difference is 1.5. With such composition, the employed epoxy resin is dispersed, in the form of substantially spherical particles (generally called "islands") having a particle diameter of 0.8 to $5\mu$, in a continuous phase (generally called "sea") of the employed rubber material. When the thus obtained adhesive material liquid is applied onto the substrate and the solvent is evaporated, there is obtained an adhesive material layer in which the epoxy resin is dispersed, in the form of the substantially spherical particles, in the rubber material.]

(5) dipping the substrate with the adhesive material layer applied thereon in a 45° C. aqueous solution of chromic acid-sulfuric acid ($CrO_3$ 100 g/liter, conc. $H_2SO_4$ 300 ml/liter) for 10 minutes to coarsen the surface of the adhesive material layer;

[at this step, a slight part of the epoxy resin is etched away together with the rubber material, but most of the epoxy resin remains undissolved, thereby to form, in the surface of the adhesive material layer, a particulate structure composed of substantially spherical particles of the cured epoxy resin. In general, the etching is effected to an extent that the component A is etched away to a depth of about 20 to 40% of the thickness of the adhesive layer. (see FIG. 2)]

(6) applying catalyst nuclei onto the surface of the adhesive material layer (this step may be omitted when the catalyst nuclei is incorporated in the adhesive material liquid);

(7) forming a circuit conductor on the adhesive material layer using known techniques to provide a printed circuit board in which circuit conductor at least the portions directly contacted with the surface of the adhesive layer is electrolessly plated with a conductor metal.

In order for the substrate surface including the inner walls of the through-holes to have catalyst nuclei (sensitizer) prior to electroless plating, there may be employed a method in which the substrate (having through-holes) with the adhesive material provided thereon is wholly dipped in a sensitizing solution or a method in which the catalyst nuclei are incorporated in the adhesive material and the catalyst nuclei-containing adhesive material is applied onto the surface of the substrate having catalyst nuclei previously contained therein. In the latter method, the catalyst nuclei previously contained in the substrate serve to provide the sensitized surfaces on the inner walls of the through-holes.

The rubber material employed as the component (A) may be vulcanized using ordinary vulcanizing agents, for example, sulfur as a vulcanizer and 2-mercaptobenzothiazole as a vulcanization accelerator. Alternatively, vulcanization may be effected using an appropriate resin.

As the curing agent for the epoxy resins, there may be employed aliphatic amines, aromatic amines, secondary amines, tertiary amines, acid anhydrides and the like. As the curing agent for the phenolic resins, there may be employed those ordinarily employed in the art, such as hexamethylenetetramine and the like. Further, as a curing accelerator, there may be employed benzyl dimethyl amine, triethanolamine, $BF_3$-monoethylamine, 2-methylimidazole, 2-ethyl-4-methyl-imidazole and the like.

As the filler, there may be employed zinc oxide, silica powder, titanium oxide, zinc sulfide, zirconium oxide, calcium carbonate, magnesium oxide and the like.

As described above, catalyst nuclei may be incorporated in the present adhesive material at the stage of preparation thereof.

With respect to the catalyzed adhesive materials (catalyst nuclei are previously incorporated in the adhesive material) and the catalyzed substrate (catalyst nuclei are previously incorporated in the substrate), the detailed explanation are given in the specifications of U.S. Pat. Nos. 3,259,559 and 3,226,256.

As the catalyst nuclei to be employed in the method of the present invention, there can be mentioned metallic palladium, copper, nickel, gold, silver, platinum, rhodium, iridium and the like; and their chlorides, oxides and the like.

With respect to sensitizing solutions to be used for applying catalyst nuclei onto the surface of the substrate, the detailed explanation is given in the specifications of U.S. Pat. Nos. 3,672,923 and 3,672,938.

As the metal to be used for forming a circuit conductor, there can be mentioned copper, nickel, gold, silver and the like.

As the substrate, there may be employed synthetic laminated boards produced by impregnating natural or synthetic base fibrous materials such as fiber glass, pulp, delinter, nylon, polyester and the like with thermosetting resins such as phenolic resins, epoxy resins, allyl phthalate resins, furan resins, melamine resins, unsaturated polyester resins and the like and pressing the resultant while heating; inorganic material-based substrates in which iron, aluminum, mica and the like are employed as the base materials; and composite substrates produced from the above-mentioned substrates.

As aforementioned, in another aspect of the present invention, there is provided a method of making a printed circuit board by the additive process which board has excellent characteristics obtained through the formation of a layer of the above-mentioned specific adhesive material on the surface of the substrate.

According to the instant aspect of the present invention, the essential method of making a printed circuit board consists in providing the sensitized surfaces of the substrate, said surfaces including the surface of the adhesive material layer formed on the whole flat face of the substrate and the surfaces of the inner walls of the through-holes formed in the substrate, and electrolessly plating the sensitized surface of the substrate with a conductor metal. The illustrative modes of the "additive" process are explained hereinbefore as the additive processes (I) and (II). When the step for formation of the adhesive material layer on the substrate is incorporated in the conventional additive process, the following modes are provided:

(a) a method of making printed circuit board in accordance with the essential method as mentioned above, wherein the sensitized surface is present over the whole surface of the adhesive material layer, and which comprises electrolessly plating an initial thin conductor metal deposit over the whole substrate surface (including the surface of the adhesive material layer and the surfaces of the inner walls of the through-holes), applying onto the electrolessly plated surface of the substrate a masking resist to form a negative image of the desired circuit pattern, electroplating the nonmasked portions of the initial thin conductor metal deposit with an additional conductor metal to build up the conductor portions of the circuit to a desired total thickness, stripping the masking resist from the noncircuit portions of the surface, and etching away all of the initial thin electroless metal deposit from the stripped portions:

(b) a method of making a printed circuit board in accordance with the essential method as mentioned above, wherein the sensitized surface is present over the whole surface of the adhesive material layer, and which comprises applying a masking resist to form a negative image of the desired circuit pattern, and electrolessly plating the nonmasked portions of the substrate surface with a conductor metal to build up the conductor portions of the circuit to a desired thickness:

(c) a method of a making a printed circuit board in accordance with the essential method as mentioned above, wherein the sensitized surface of the adhesive material layer is formed by applying catalyst nuclei onto the oxidizing agent-treated layer surface at a preselected circuit pattern portions thereof to restrict the sensitized surface to the preselected circuit pattern portions, and which comprises, following catalyzation, electrolessly plating the sensitized circuit pattern portions of the substrate surface (including the surface of the adhesive material layer and the surfaces of the inner walls of the through-holes) with a conductor metal to build up the conductor portions of the circuit to a desired thickness: and (d) a method according to item (c) above, wherein the restricted formation of sensitized surface is effected by covering the oxidizing agent-treated layer surface of the substrate at its portions other than those as will provide a printed pattern circuit with a detachable film, dipping the film-covered substrate in a sensitizing solution and removing the film.

As the improvement of the method as mentioned in item c) above, there have recently been proposed a method in which the metallic catalyst nuclei are photochemically deposited only at the portions as will provide a printed pattern circuit. This improved method is detailedly described in the specification of U.S. Pat. No. 3,772,078, and hereinafter referred to as the "photo-forming" process.

The "photo-forming" process consists in:

(1) forming an adhesive material layer on the substate, subjecting the adhesive material layer to heat-curing treatment, forming through-holes in the substrate and treating the layer surface with an oxidizing agent to coarsen the layer surface;

(2) treating said oxidizing agent-treated layer surface of the substrate with a solution of a radiation-sensitive composition comprising a reducible salt of a metal capable of serving as a catalyst for electroless plating of a conductor metal (the reducible salts include, for example, cupric acetate, cupric bromide and the like.), a radiation-sensitive reducing agent for said salt such as an aromatic diazo compound, disodium salt of anthraquinone-2,6-disulfonic acid or the like, a secondary reducer such as sorbitol, pentaerythritol or the like, and optionally a surfactant in an acid-containing liquid medium, followed by drying thereby to deposit on said oxidizing agent-treated layer of the substrate a layer of the radiation-sensitive composition;

(3) attaching onto the treated layer surface of the substrate a film having a negative image of the circuit pattern which film is capable of selectively causing the circuit pattern portions including the flat circuit portions and the inner walls of the through-holes to be irradiated with radiant energy such as ultraviolet rays, visible rays, X-rays or the like;

(4) exposing through said film said layer of the radiation-sensitive composition to radiant energy to reduce said metal salt to metallic nuclei thereof, whereby there is formed the sensitized surface restricted to the preselected circuit pattern portions;

(5) detaching said film from said layer and washing the substrate with water to remove the radiation-sensitive composition remaining unreacted; and (6) electrolessly plating the sensitized circuit pattern portions of the substate surface with a conductor metal to build up the conductor portions of the circuit to a desired thickness.

The photo-forming process has an advantage that the manufacturing cost of the printed circuit board is considerably reduced, because it is unnecessary to employ a copper-clad substrate and because it is unnecessary not only to incorporate catalyst nuclei in the substrate and/or the adhesive material but also to employ additional materials necesssary for selectively forming a pattern circuit such as an etching resist (a dry film, gold or solder-plating) or a masking resist for electroless plating. In addition, it is noted that according to the photo-forming process the catalyst nuclei are present in the metallic state on the circuit pattern image so that the catalyst nuclei effectively function as catalyst for electroless plating, and the electroless deposition of the metal begins concurrently at the flat circuit portions and at the inner walls of the through-hole portions immediately upon dipping of the substate in an electroless plating solution. Thus, there is obtained excellent continuity between the crystals of the metals deposited on the flat circuit portions and on the inner walls of the through-hole portions. Accordingly, there is obtained an improved reliability with respect to connection of the through-holes to the flat circuit portions.

On the other hand, in order to effectively realize excellent performance of the photo-forming process, it is required for the substrate to be excellent with respect not only to adhesion to the circuit conductor metal deposit, electrical properties, chemicals-resistance, heat-resistance and the like which are all commonly required for any kind of the conventional printed circuit boards, but also to the following special aspect. Illustratively stated, the amount of the metallic catalyst nuclei reduction-deposited on the adhesive material layer of the substrate by photochemical reaction is necessarily maintained at a level sufficient for electroless plating until the electroless plating stage. By the conventional methods, however, not only in the step of removing the negative image film, the metallic catalyst nuclei tend to be considerably transferred from the surface of the substrate to the film, but also in the step of washing the substrate with water to remove the radiation-sensitive composition remaining unreacted, the metallic catalyst nuclei tend to considerably come off from the surface of the substrate and to run away, so that it is hardly possible to eliminate such a fear that the circuit pattern image of catalyst for electroless plating disappears. For this reason, by the conventional methods, it is difficult to manufacture printed circuit boards with high reliability, utilizing the photo-forming process.

For example, referring again to FIG. 1, the adhesive material layer has a wavy structure and hence, the metallic catalyst nuclei deposited thereon are securely attached onto the surfaces of the wavy structure layer so that the catalyst nuclei do not so easily run away in the step of the waterwashing. However, due to the relatively high deformability and the low heat distortion temperature of the adhesive material employed, the shape or structure of the coarsened layer surface readily undergoes distortion by the action of the pressure exerted on the layer surface when attaching of the negative image film onto the surface is conducted by the vacuum method and sometimes by the action of the heat generated at the time of irradiation, so that the contact area between the adhesive material layer and the film is increased, causing the transfer of the metallic catalyst nuclei such as copper to the film to be disadvantageously increased. On the other hand, if the deformability is reduced and the heat distortion temperature of the adhesive material is improved by various methods, the adhesive material layer surface becomes difficult to coarsen by etching and, as a result, there is hardly obtained a desired wavy structure surface so that the catalyst nuclei tend to readily run away in the step of the water-washing.

The adhesive material to be employed in the method of the present invention exerts an excellent effect in practicing the photo-forming process. Illustratively stated, the coarsened surface obtained by treating the present adhesive material layer with an oxidizing agent contains a number of convex structural units composed of the substantially spherical heat-cured thermoset resin particles. For this reason, even when the negative image film is closely attached onto the adhesive material layer surface, the contact area between the film and the layer surface is relatively small in the step of exposure and hence, the particulate metallic catalyst nuclei reduction-deposited by photochemical reaction are secured until the stage for electroless plating without occurrence of the transfer of the catalyst nuclei to the film. Accordingly, disappearance of the circuit pattern image of catalyst for electroless plating is not observed in any of the circuit pattern image portions, thus providing a high density and high precision printed circuit board with high reliability and excellent sharpness. When the present adhesive material is employed for manufacturing printed circuit boards by the photo-forming process, there can be attained, besides the reliable formation of the pattern circuit, the following effects, that is, radiant energy can be utilized, with high efficiency, for reduction-depositing metallic catalyst nuclei from the aqueous solution of the radiation-sensitive composition, and the circuit formed by the photo-forming process using the present adhesive material is excellent in heat-resistance and no blistering occurs even by dipping the obtained printed circuit board in the solder bath at 260° C. for 3 minutes.

The present invention will now be described in detail by reference to the following Examples that is by no means limiting the scope of the present invention. In Examples, parts and percent are given on a weight basis unless otherwise specified. The properties shown in the specification as well as Examples were measured by the following methods.

Particle diameter:
Visually measured using a microphotograph taken employing a scanning electron microphotographic apparatus HSM2 (manufactured by Hitachi Ltd. Japan)

Composition ratio (% by volume):
Calculated from the value obtained dividing the weights of the respective materials charged by their respective specific gravities.

Solubility parameter (SP):
Calculated from the formula $$d\Sigma G/M$$

wherein
G = molar attraction constant
d = specific gravity
M = molecular weight

[with respect to the component having a mixed system, SP value $(SP)_{mix}$ is calculated from the formula $$\Sigma W_i (SP)_i / 100$$

wherein
$(SP)_i$ = SP value of respective component (i) of the mixed system
$W_i$ = weight % of the component (i) based on the total weight of the mixed system]

Weight average molecular weight:
HLC measuring apparatus = Model 802 manufactured by Toyo Soda Co., Ltd. Japan
Column = G3000H$_6$ (one) and G2000 (three) manufactured by Toyo Soda Co., Ltd.
Solvent = Tetrahydrofuran (about 2 wt %)
Flowing velocity = 1.5 ml/min.
Measuring temperature 40° C. (column temperature)

Peel strength:
Measured in accordance with the method prescribed in Japanese Industrial Standards (JIS) No. C6481, 5.7

Solder test:
Conducted in accordance with the method prescribed in JIS No. C6481, 5.5

EXAMPLE 1

Into 400 parts of methyl ethyl ketone and 30 parts of methyl cellosolve were added and mixed 100 parts of a bisphenol A type epoxy resin EPIKOTE 1001 (trade name of a product of Shell Chemical), 70 parts of an acrylonitrile-butadiene copolymer N-1032 (trade name of a product of Nihon Zeon K.K., Japan), 0.7 part of powdery sulfur, 0.07 part of 2-mercaptobenzothiazole, 10 parts of zinc oxide, 0.03 part of palladium (II) chloride, 3 parts of dicyandiamide and 0.3 part of CURESOLE C$_{11}$ Z-AZINE (trade name of a product of Shikoku Kasei K.K., Japan), to form a uniform liquid resin composition.

The so formed resin composition was applied onto a catalyst-containing fiber glass-reinforced epoxy type substrate LE-161 (trade name of a product of Hitachi Chemical Co., Japan) (at a dry thickness of 50μ) and dried, using a hot-air dryer, at 130° C. for 5 minutes, followed by heating at 160° C. for 60 minutes to effect curing in air, to obtain a laminate board having the adhesive resin composition layer in which the heat-cured particles having a diameter of 0.5 to 4μ were dispersed.

After forming through-holes in the laminate board and cleansing the surface thereof and the inner walls of the through-holes, a masking resist made of an epoxy type resin of HPR-404V (trade name of a product of Hitachi Chemical Co., Japan) was provided, using a screen printing machine, on the laminate board in its portions other than those as will provide a printed pattern circuit, followed by heating at 130° C. for 30 minutes to effect curing.

The laminate board with the masking resist provided thereon was dipped for 10 minutes in a 45° C. aqueous solution of chromic acid-sulfuric acid (CrO$_3$ 100 g/liter; conc. H$_2$SO$_4$ 300 ml/liter) to effect coarsening of the layer prepared from the aforementioned resin composition.

The thus treated laminate board was dipped for 30 hours in a 70° C. aqueous electroless copper plating solution (copper (II) sulfate 0.03 mole/liter; sodium hydroxide 0.125 mole/liter; sodium cyanide 0.0004 mole/liter; formaldehyde 0.08 mole/liter; sodium ethylenediaminetetraacetate 0.036 mole/liter) to obtain a printed circuit board.

The peel strength between the conductor metal deposit and the surface of the resin layer of the obtained printed circuit board was 2.3 kg/cm. When the printed circuit board was dipped for 3 minutes in a solder bath maintained at 260° C., no blistering was caused.

EXAMPLE 2

Into 400 parts of methyl ethyl ketone and 30 parts of methyl cellosolve were added and mixed 80 parts of a bisphenol A type epoxy resin EPIKOTE 1002 (trade name of a product of Shell Chemical), 20 parts of a novolak type epoxy resin EPIKOTE 154 (trade name of a product of Shell chemical), 80 parts of an acrylonitrile-butadiene copolymer N-1001 (trade name of a product of Nihon Zeon K.K., Japan), 0.8 part of powdery sulfur, 0.08 part of 2-mercaptobenzothiazole, 0.03 part of palladium(II) chloride, 3 parts of dicyandiamide, 0.3 part of CURESOLE C$_{11}$ Z-AZINE and 10 parts of ZrSiO$_4$ [MICROPAX A-20 (trade name of a product of Hakusui Kagaku Kogyo K.K., Japan)], to form a uniform resin composition.

The so formed resin composition was applied onto a catalyst-containing fiber glass-reinforced epoxy type substrate LE-161 (at a dry thickness of 50μ) and dried, using a hot-air dryer, at 130° C. for 5 minutes, followed by heating at 160° C. for 60 minutes to effect curing in air, to obtain a laminate board having the adhesive resin composition layer in which the heat-cured particles having a diameter of 2 to 6μ were dispersed.

After forming through-holes in the laminate board and cleansing the surfaces thereof and the inner walls of the through-holes, a masking resist made of a RISTON film Type 6 (trade name of a product of Du Pont Company, U.S.A.) was attached onto the laminate board in its portions other than those as will provide a printed pattern circuit.

The laminate board with the masking resist attached thereonto was heated at 130° C. for 40 minutes. Thereafter, the steps of dipping in a 45° C. aqueous solution of chromic acid-sulfuric acid and dipping in an aqueous electroless copper plating solution were, in sequence, effected in the same manner as described in Example 1.

The masking resist was removed using methylene chloride to obtain a printed circuit board.

The peel strength between the conductor metal deposit and the surface of the resin layer of the obtained printed circuit board was 2.1 kg/cm. When the printed circuit board was dipped for 3 minutes in a solder bath maintained at 260° C., no blistering was caused.

EXAMPLE 3

Substantially the same resin composition as used in Example 1 except that palladium(II) chloride was not contained therein, was applied onto an epoxy resin-impregnated paper substrate LE-47 (trade name of a product of Hitachi Chemical Co., Japan) (at a dry thickness of 50μ) and dried, using a hot-air dryer, at 130° C. for 5 minutes, followed by heating at 160° C. for 60 minutes to effect curing in air, to obtain a laminate board having the adhesive resin composition layer in which the heat-cured particles having a diameter of 0.5 to 4μ were dispersed.

After forming through-holes in the laminate board and cleansing the surfaces thereof and the inner walls of the through-holes, the step of dipping in a 45° C. aqueous solution of chromic acid-sulfuric acid was carried out in the same manner as described in Example 1 to effect coarsening of the layer prepared from the aforementioned resin composition.

The so treated laminate board was dipped for 10 minutes in a palladium-containing sensitizing solution HS-101B (trade name of a product of Hitachi Chemical Co., Japan) to sensitize the coarsened surfaces and the inner walls of the through-holes for electroless copper plating.

The thus treated laminate board was dipped for 2 hours in the 70° C. aqueous electroless copper plating solution of the same composition as that used in Example 1 to deposit a 3μ-thick copper layer on the coarsened surfaces and the inner walls of the through-holes.

Onto the thus electrolessly copper-plated laminate board in its portions other than those as will provide a printed pattern circuit was attached a masking resist made of a RISTON film, followed by heating at 130° C. for 40 minutes.

The laminate board with the masking resist attached thereonto was dipped for 45 minutes in a 55° C. aqueous electrolytic copper plating solution [copper pyrophosphate 85 g/liter; potassium pyrophosphate 310 g/liter; ammonia water containing 25% by weight of ammonia 3 ml/liter; a brightener PYROLITE PY-61 (trade name of a product of Uemura Kogyo K.K., Japan) 3 ml/liter] while flowing electric current at a cathode current density of 3 A/100 cm².

The masking resist was removed using methylene chloride.

The resulting laminate board was dipped in a 40° C. aqueous solution of ammonium persulfate [$(NH_4)_2S_2O_8$ 100 g/liter] to remove the portions of the copper layer other than those as will provide a printed pattern circuit. As a result, a printed circuit board was obtained.

The peel strength between the conductor metal deposit and the surface of the resin layer of the obtained printed circuit board was 2.1 kg/cm. When the printed circuit board was dipped for 3 minutes in a solder bath maintained at 260° C., no blistering was caused.

EXAMPLE 4

Substantially the same resin composition as used in Example 2 except that palladium(II) chloride was not contained therein, was applied onto a phenol resin-impregnated paper substrate LP-414F (trade name of a product of Hitachi Chemical Co., Japan) (at a dry thickness of 50μ) and dried, using a hot-air dryer, at 130° C. for 5 minutes, followed by heating at 160° C. for 60 minutes to effect curing in air, to obtain a laminate board having the adhesive resin composition layer in which the heat-cured particles having a diameter of 2 to 6μ were dispersed.

After forming through-holes in the laminate board and cleansing the surfaces thereof and the inner walls of the through-holes, the step of dipping in a 45° C. aqueous solution of chromic acid-sulfuric acid was carried out in the same manner as described in Example 1 to effect coarsening of the layer prepared from the aforementioned resin composition and the step of dipping in a palladium containing-sensitizing solution HS-101B was carried out in the same manner as described in Example 3 to sensitize the coarsened surfaces and the inner walls of the through-holes for electroless copper plating.

The so treated laminate board was dipped for 2 hours in a 25° C. electroless copper plating solution CUST 101 (trade name of a product of Hitachi Chemical Co., Japan) to deposit a 3μ-thick copper layer on the coarsened surfaces and the inner walls of the through-holes.

After the step of attaching a masking resist onto the thus electrolessly copper-plated laminate board, heating and electroplating were conducted in the same manner as described in Example 3.

The steps of removing the masking resist and dipping in a 40° C. aqueous solution of ammonium persulfate were, in sequence, effected in the same manner as described in Example 3 to obtain a printed circuit board.

The peel strength between the conductor metal deposit and the surface of the resin layer of the obtained printed circuit board was 2.3 kg/cm. When the printed circuit board was dipped for 3 minutes in a solder bath maintained at 260° C., no blistering was caused.

EXAMPLES 5 AND 6

Printed circuit boards were produced in substantially the same manner as described in Example 3 except that recipes of resin compositions were as indicated in Table 1. The obtained results are also shown in Table 2 in which "HMT" means hexamethylenetetramine and "MEK" means methyl ethyl ketone.

Table 1

| Ex. | Recipe Ingredient | Amount | Diameter | Peel Strength | Solder Test |
|---|---|---|---|---|---|
| 5 | N-1032 | 25 parts | 1–3 μ | 2.4 kg/cm | No blistering |
|  | HP-607N | 100 |  |  |  |
|  | HMT | 10 |  |  |  |
|  | Sulfur | 0.35 |  |  |  |
|  | 2MBT | 0.02 |  |  |  |
|  | PZ | 0.02 |  |  |  |
|  | ZnO | 10 |  |  |  |
|  | MEK | 250 |  |  |  |
| 6 | N-1032 | 50 parts | 2–7 μ | 2.0 kg/cm | No blistering |
|  | VP-13N | 75 |  |  |  |
|  | H-2400 | 25 |  |  |  |
|  | Sulfur | 0.5 |  |  |  |
|  | 2MBT | 0.05 |  |  |  |
|  | ZnO | 5 |  |  |  |
|  | ZrSiO$_4$ | 15 |  |  |  |
|  | MEK | 150 |  |  |  |
|  | Toluene | 150 |  |  |  |

Note
N-1032: acrylonitrile-butadiene copolymer
HP-607N: novolak type phenolic resin
H-2400: alkylphenolic resin
2MBT: 2-mercaptobenzothiazole
PZ: zinc dimethyl dithiocarbamate
VP-13N: resol type phenolic resin
Diameter: diameter of the heat-cured particles
Peel Strength: between the conductor metal deposit (3.5 μ thick) and the surface of the resin layer of the printed circuit board
Solder Test: dipped for 3 minutes in a solder bath maintained at 260° C.

EXAMPLES 7 AND 8

Printed circuit boards were produced in substantially the same manner as described in Example 4 except that recipes of resin compositions were as indicated in Table 2. The obtained results are also shown in Table 3 in which "HMT" and "MEK" have the same meanings as in Table 1.

Table 2

| Ex. | Recipe Ingredient | Amount | Diameter | Peel Strength | Solder Test |
|---|---|---|---|---|---|
| 7 | N-1032 | 70 parts | 1–4 μ | 2.3 kg/cm | No blistering |
|  | HP-607N | 80 |  |  |  |
|  | HMT | 8 |  |  |  |
|  | H-2400 | 20 |  |  |  |
|  | Sulfur | 0.7 |  |  |  |
|  | 2MBT | 0.1 |  |  |  |
|  | ZnO | 5 |  |  |  |
|  | ZrSiO$_4$ | 15 |  |  |  |
|  | MEK | 300 |  |  |  |
| 8 | N-1032 | 30 parts | 4–11 μ | 2.2 kg/cm | No blistering |
|  | VP-13N | 75 |  |  |  |
|  | H-2400 | 25 |  |  |  |
|  | Sulfur | 0.3 |  |  |  |
|  | 2MBT | 0.03 |  |  |  |
|  | ZnO | 5 |  |  |  |
|  | ZrSiO$_4$ | 10 |  |  |  |
|  | MEK | 150 |  |  |  |
|  | Xylene | 100 |  |  |  |

EXAMPLE 9

Into 400 parts of methyl ethyl ketone and 30 parts of methyl cellosolve were added and mixed 100 parts of EPIKOTE 1001, 70 parts of an acrylonitrile-butadiene copolymer N-1032, 0.7 part of powdery sulfur, 0.07 part of 2-mercaptobenzothiazole, 20 parts of ZnO, 3 parts of dicyandiamide and 0.3 part of CURESOLE C$_{11}$ Z-AZINE, to form a uniform resin composition.

The so formed resin composition was applied onto a fiber glass-reinforced epoxy type substrate at a dry thickness of 50μ and dried, using a hot-air dryer, at 130° C. for 5 minutes, followed by heating at 160° C. for 60 minutes to effect curing in air, to obtain a laminate board having the adhesive resin composition layer in which the heat-cured particles having a diameter of 0.5 to 4μ were dispersed. Thereafter, through-holes were formed in the laminate board.

The laminate board with the through-holes formed therein was dipped for 15 minutes in a 45° C. aqueous solution of chromic acid-sulfuric acid (CrO$_3$ 100 g/liter; conc. H$_2$SO$_4$ 300 ml/liter) and then dipped for 13 minutes in an aqueous neutralizing solution (NaHSO$_3$ 20 g/liter; pH=4.0; room temperature).

The so treated laminate board was dipped for 5 minutes in a 40° C. aqueous solution of a radiation-sensitive composition [copper (II) acetate 8 g/liter; glycerin 16 g/liter; sorbitol 120 g/liter; pentaerythritol 10 g/liter], followed by drying at 80° C. for 5 minutes and allowing to stand for 15 minutes at room temperature.

The thus treated laminate board was closely contacted with a negative film and irradiated, through the negative film, with ultraviolet rays (intensity 30 mW/cm$^2$) for 60 seconds.

After washing with flowing water for 60 seconds, the irradiated laminate board was dipped for 30 hours in a 70° C. aqueous electroless copper plating solution [copper (II) sulfate 0.03 mole/liter; sodium hydroxide 0.125 mole/liter; sodium cyanide 0.0004 mole/liter; formaldehyde 0.08 mole/liter; sodium ethylenediaminetetraacetate 0.036 mole/liter] to obtain a printed circuit board. Non-deposition of the conductor metal was not observed on any of the circuit pattern image portions.

The peel strength between the conductor metal deposit and the surface of the resin layer of the obtained printed circuit board was 2.3 kg/cm. When the printed circuit board was dipped for 3 minutes in a solder bath maintained at 260° C., no blistering was caused.

EXAMPLES 10 TO 29

Printed circuit boards were produced in substantially the same manner as described in Example 9 except that there were used resin compositions as described below. With respect to any of the resin compositions, non-deposition of the conductor metal was not observed on any of the circuit pattern image portions. With respect to any of the printed circuit boards, when it was dipped for 3 minutes in a solder bath maintained at 260° C., no blistering was caused. With respect to all of Examples 10 to 29, the data of diameter of the heat-cured particles dispersed in the adhesive resin composition layer and the data of peel strength between the conductor metal deposit and the surface of the resin layer of the printed circuit board are shown in Table 3.

(EXAMPLE 10)

There was employed a resin composition composed of 80 parts of EPIKOTE 1002, 20 parts of EPIKOTE 154, 80 parts of an acrylonitrile-butadiene copolymer N-1001, 0.8 part of powdery sulfur, 0.08 part of 2-mercaptobenzothiazole (hereinafter referred to as 2MBT), 3 parts of dicyandiamide, 10 parts of ZrSiO$_4$, 400 parts of methyl ethyl ketone (hereinafter referred to as "MEK") and 30 parts of methyl cellosolve.

(EXAMPLE 11)

There was employed a resin composition composed of 100 parts of EPIKOTE 1004, 100 parts of an acrylonitrile-butadiene copolymer N-1001, 1 part of powdery sulfur, 0.1 part of 2MBT, 3 parts of dicyandiamide, 2 parts of ZnO, 15 parts of ZrSiO$_4$, 400 parts of toluene and 30 parts of methyl cellosolve.

(EXAMPLE 12)

There was employed a resin composition composed of 75 parts of EPIKOTE 1004, 25 parts of EPIKOTE 154, 40 parts of an acrylonitrile-butadiene copolymer N-DN401, 0.4 part of powdery sulfur, 0.04 part of 2MBT, 3 parts of dicyandiamide, 5 parts of magnesium oxide, 15 parts of ZrSiO$_4$, 150 parts of MEK, 150 parts of toluenes, and 30 parts of methyl cellosolve.

(EXAMPLE 13)

There was employed a resin composition composed of 80 parts of EPIKOTE 1001, 20 parts of EPIKOTE 154, 60 parts of an acrylonitrile-butadiene copolymer N-1001, 5 parts of HYPALON 20 (trade name of a product of Showa Neoprene K.K. Japan), 0.6 part of powdery sulfur, 0.06 part of 2MBT, 3 parts of dicyandiamide, 2 parts of TiO$_2$, 15 parts of CaCO$_3$, 400 parts of MEK and 30 parts of methyl cellosolve.

(EXAMPLE 14)

There was employed a resin composition composed of 80 parts of EPIKOTE 1001, 20 parts of EPIKOTE 154, 40 parts of an acrylonitrile-butadiene copolymer N-1001, 5 parts of a phenoxy resin FAHJ (trade name of a product of Union Carbide Corp., U.S.A.), 0.4 part of powdery sulfur, 0.04 part of 2MBT, 3 parts of dicyandiamide, 10 parts of CaCO$_3$, 200 parts of MEK, 150 parts of ethyl acetate and 30 parts of methyl cellosolve.

(EXAMPLE 15)

There was employed a resin composition composed of 90 parts of EPIKOTE 1001, 10 parts of CHISSONOX 221, 25 parts of an acrylonitrile-butadiene copolymer H-1000×132, 0.3 part of powdery sulfur, 0.03 part of 2MBT, 12 parts of ZnO, 3 parts of dicyandiamide, 0.3 part of CURESOLE C$_{11}$Z-AZINE (hereinafter referred to as C$_{11}$Z-AZINE), and 150 parts of MEK, 150 parts of ethylacetate and 30 parts of methyl cellosolve.

(EXAMPLE 16)

There was employed a resin composition composed of 90 parts of EPIKOTE 1002, 10 parts of CHISSONOX 221, 70 parts of an acrylonitrile-butadiene copolymer N-DN401, 0.7 part of powdery sulfur, 0.07 part of 2MBT, 20 parts of ZnO, 3 parts of dicyandiamide, 0.3 part of C$_{11}$Z-AZINE, 200 parts of MEK, 200 parts of xylene and 30 parts of methyl cellosolve.

(EXAMPLE 17)

There was employed a resin composition composed of 90 parts of EPIKOTE 1002, 10 parts of CHISSONOX 289, 30 parts of an acrylonitrile-butadiene copolymer N-1032, 0.3 part of powdery sulfur, 0.03 part of 2MBT, 8 parts of ZnO, 4 parts of dicyandiamide, 0.4 part of C$_{11}$Z-AZINE, 300 parts of MEK and 40 parts of methyl cellosolve.

(EXAMPLE 18)

There was employed a resin composition composed of 70 parts of EPIKOTE 1002, 30 parts of EPIKOTE 154, 80 parts of NEOPRENE AD, 0.8 part of powdery sulfur, 0.08 part of 2MBT, 20 parts of ZnO, 5 parts of dicyandiamide, 0.5 parts of C$_{11}$Z-AZINE, 200 parts of toluene, 200 parts of xylene and 50 parts of methyl cellosolve.

(EXAMPLE 19)

There was employed a resin composition composed of 75 parts of EPIKOTE 1002, 25 parts of EPIKOTE 152, 100 parts of NEOPRENE AD, 1.0 part of powdery sulfur, 0.10 part of 2MBT, 24 parts of ZnO, 3 parts of dicyandiamide, 0.4 part of C$_{11}$Z-AZINE, 200 parts of MEK, 200 parts of ethyl acetate and 30 parts of methyl cellosolve.

(EXAMPLE 20)

There was employed a resin composition composed of 70 parts of EPIKOTE 1004, 30 parts of EPIKOTE 152, 90 parts of NEOPRENE W, 2.9 parts of powdery sulfur, 0.29 part of 2MBT, 40 parts of ZnO, 6 parts of dicyandiamide, 0.6 part of C$_{11}$Z-AZINE, 250 parts of MEK, 250 parts of ethyl acetate and 60 parts of methyl cellosolve.

(EXAMPLE 21)

There was employed a resin composition composed of 90 parts of EPIKOTE 1004, 10 parts of CHISSONOX 206, 90 parts of NEOPRENE GN, 3.5 parts of powdery sulfur, 0.35 part of 2MBT, 40 parts of ZnO, 6 parts of dicyandiamide, 0.6 part of C$_{11}$Z-AZINE, 250 parts of MEK, 250 parts ethyl acetate and 60 parts of methyl cellosolve.

(EXAMPLE 22)

There was employed a resin composition composed of 80 parts of EIPKOTE 1002, 20 parts of CHISSONOX 289, 100 parts of NEOPRENE AD, 4.0 parts of powder sulfur, 0.40 part of 2MBT, 60 parts of ZnO, 7 parts of dicyandiamide, 0.7 part of C$_{11}$Z-AZINE, 500 parts of toluene and 70 parts of methyl cellosolve.

(EXAMPLE 23)

There was employed a resin composition composed of 100 parts of EPIKOTE 1001, 200 parts of NEOPRENE AD, 0.8 part of powdery sulfur, 0.08 part of 2MBT, 21 parts of ZnO, 3 parts of dicyandiamide, 0.4 part of C$_{11}$Z-AZINE, 350 parts of toluene, 350 parts of ethyl acetate and 30 parts of methyl cellosolve.

(EXAMPLE 24)

There was employed a resin composition composed of 75 parts of EPIKOTE 836, 25 parts of EPIKOTE 154, 100 parts of a polybutadiene N-BR-1441, 1.0 part of powdery sulfur, 0.10 part of 2MBT, 24 parts of ZnO, 3 parts of dicyandiamide, 0.4 part of C$_{11}$Z-AZINE, 200 parts of MEK, 200 parts of ethyl acetate and 30 parts of methyl cellosolve.

(EXAMPLE 25)

There was employed a resin composition composed of 80 parts of EPIKOTE 1001, 20 parts of EPIKOTE 152, 300 parts of a polybutadiene N-BR-1220, 2.9 parts of powdery sulfur, 0.29 part of 2MBT, 40 part of ZnO, 6 parts of dicyandiamide, 0.6 part of C$_{11}$Z-AZINE, 800 parts of MEK and 60 parts of methyl cellosolve.

(EXAMPLE 26)

There was employed a resin composition composed of 50 parts of EPIKOTE 1002, 30 parts of EPIKOTE 834, 20 parts of CHISSONOX 221, 100 parts of a polybutadiene N-BR-1220, 1.4 parts of powdery sulfur, 0.15 part of 2MBT, 21 parts of ZnO, 4 parts of dicyandiamide, 0.4 part of C$_{11}$Z-AZINE, 250 parts of MEK, 250 parts of xylene and 40 parts of methyl cellosolve.

(EXAMPLE 27)

There was employed a resin composition composed of 90 parts of EPIKOTE 1002, 10 parts of CHISSONOX 289, 350 parts of a polybutadiene N-BR-1441, 3.5 parts of powdery sulfur, 0.35 part of 2MBT, 40 parts of ZnO, 6 parts of dicyandiamide, 0.6 part of C$_{11}$Z-AZINE, 450 parts of MEK, 450 parts of toluene and 60 parts of methyl cellosolve.

(EXAMPLE 28)

There was employed a resin composition composed of 100 parts of EPIKOTE 1001, 300 parts of a polybutadiene N-BR-1220, 2.9 parts of powdery sulfur, 0.29 part of 2MBT, 40 parts of ZnO, 6 parts of dicyandiamide, 0.6 part of C$_{11}$Z-AZINE, 800 parts of MEK and 60 parts of methyl cellosolve.

(EXAMPLE 29)

There was employed a resin composition composed of 80 parts of EPIKOTE 1002, 10 parts of EPIKOTE 154, 10 parts of an alkylphenolic resin H-2400, 80 parts of an acrylonitrilebutadiene copolymer N-1001, 0.8 part of powdery sulfur, 0.08 part of 2MBT, 3 parts of dicyandiamide, 10 parts of ZrSiO$_4$, 400 parts of MEK and 30 parts of methyl cellosolve.

Throughout Examples 1 to 29, the plating operation was conducted to give the printed circuit board having a 35 μ-thick conductor metal deposit thereon.

Table 3

| Example | Diameter (μ) | Peel Strength (kg/cm) |
|---|---|---|
| 10 | 2-6 | 2.1 |
| 11 | 5.5-8.5 | 2.0 |
| 12 | 3.5-8.0 | 2.0 |
| 13 | 1-5 | 2.3 |
| 14 | 7-15 | 2.0 |
| 15 | 2-11 | 1.9 |
| 16 | 1-5 | 2.4 |
| 17 | 3-12 | 2.0 |
| 18 | 7-13 | 2.3 |
| 19 | 5.5-9 | 2.0 |
| 20 | 2-7 | 2.3 |
| 21 | 1-4.5 | 2.5 |
| 22 | 1-12 | 2.7 |
| 23 | 7-13 | 2.3 |
| 24 | 3-11 | 2.2 |
| 25 | 2.5-10 | 2.5 |
| 26 | 2-5 | 2.5 |
| 27 | 1-6 | 2.4 |
| 28 | 2.5-10 | 2.5 |
| 29 | 1-4 | 2.5 |

The SP values of the resins used in Examples are shown in Table 4.

Table 4

| Classification by Component | Name of Resin | SP value |
|---|---|---|
| A | N-1001 | 9.7 |
| | N-1032 | 9.4 |
| | N-DN401 | 8.8 |
| | H-1000x132 | 9.9 |
| | NEOPRENE AD | 9.3 |
| | NEOPRENE GN | 9.2 |
| | NEOPRENE W | 9.2 |
| | N-BR-1220 | 8.5 |
| | N-BR-1441 | 8.5 |
| | EPIKOTE 1004 | 11.0 |
| | EPIKOTE 1002 | 11.3 |
| | EPIKOTE 1001 | 11.3 |

Table 4-continued

| Classification by Component | Name of Resin | SP value |
|---|---|---|
| | EPIKOTE 836 | 11.2 |
| | EPIKOTE 834 | 9.3 |
| | EPIKOTE 154 | 8.9 |
| | EPIKOTE 152 | 8.9 |
| B | CHISSONOX 221 | 9.2 |
| | CHISSONOX 289 | 9.1 |
| | CHISSONOX 206 | 8.0 |
| | HP-607N | 10.8 |
| | VP-13N | 10.6 |
| | H-2400 | 9.9 |

What is claimed is:

1. A method of rendering the surface of an insulating substrate adhesive and catalytic to a metal deposit electrolessly plated thereon which comprises the steps of:

(1) forming on the surface of an insulating substrate a layer of an adhesive material comprising (A) a rubber material selected from the group consisting of an acrylonitrile-butadiene copolymer, polychloroprene, polybutadiene and mixtures thereof and (B) a thermosetting resin selected from the group consisting of a bisphenol A type epoxy resin, a novolak type epoxy resin, an alicyclic glycidyl ether resin, a resol type phenolic resin, a novolak type phenolic resin, an alkylphenolic resin and mixtures thereof, the component (B) being dispersed, in the form of substantially spherical particles having a particle diameter of 0.5 to 15μ, in a continuous phase of the component (A) and present in a proportion defined by the formula $20 \leq (B)/(A)+(B) \leq 85\%$ by volume, and having an Solubility Parameter value 1 to 4 higher than that of said component (A);

(2) subjecting the adhesive material to heat-curing treatment; and (3) treating the layer surface of the heat-curing treated adhesive material with an oxidizing agent to effect etching of the component (A) whereby the heat-cured particles of the component (B) appear in the surface of said adhesive material layer; the oxidizing agent-treated layer surface being sensitized for electroless plating by applying catalyst nuclei onto said oxidizing agent-treated layer surface after the step (3).

2. A method according to claim 1, wherein said layer of the adhesive material is formed at a thickness of 30 to 60μ.

3. A method according to claim 1, wherein the heat-curing treatment is conducted by heating at a temperature of about 130° to 180° C. for 0.5 to 2 hours.

4. A method according to claim 1, wherein said etching of the component (A) is effected to an extent that the component (A) in the adhesive layer is etched away to a depth of about 20 to 40% of the thickness of the adhesive layer.

5. A method of making a printed circuit board in accordance with the method of claim 1, which comprises, following step (3), treating said oxidizing agent-treated layer surface of the substrate with a solution of a radiation sensitive composition comprising a reducible salt of a metal capable of serving as a catalyst for electroless plating of a conductor metal, a radiation-sensitive reducing agent for said salt and a secondary reducer in an acid-containing liquid medium thereby to deposit on said oxidizing agent-treated layer of the substrate a layer of the radiation-sensitive composition; attaching a film having a negative image of the circuit pattern onto the treated layer surface of the substrate; exposing said layer of the radiation-sensitive composition through said film to radiant energy to reduce said metal salt to metallic nuclei thereof whereby the circuit pattern portions are selectively sensitized for electroless plating; detaching said film from said layer; and following sensitization, electrolessly plating the sensitized circuit pattern portions of the substrate surface with a conductor metal to build up the conductor portions of the circuit to a desired thickness.

6. A method of rendering the surface of a substrate adhesive and catalytic to a metal deposit electrolessly plated thereon which comprises the steps of:

(1) forming on the surface of an insulating substrate a layer of an adhesive material comprising (A) a rubber material selected from the group consisting of an acrylonitrile-butadiene copolymer, polychloroprene, polybutadiene and mixtures thereof, (B) a thermosetting resin selected from the group consisting of a bisphenol A type epoxy resin, a novolak type epoxy resin, an alicyclic glycidyl ether resin, a resol type phenolic resin, a novolak type phenolic resin, an alkylphenolic resin and mixtures thereof and (C) catalyst nuclei, the component (B) being dispersed, in the form of substantially spherical particles having particle diameter of 0.5 to 15$\mu$, in a continuous phase of component (A) and present in a proportion defined by the formula $20 \leq (B)/(A)+(B) \leq 85\%$ by volume and having a Solubility Parameter value 1 to 4 higher than that of said component (A);

(2) subjecting the adhesive material to heat-curing treating; and (3) treating the layer surface of the heat-curing treated adhesive material with an oxidizing agent to effect etching of the component (A) whereby the heatcured particles of the component (B) appear in the surface of said adhesive layer surface being sensitized for electroless plating.

* * * * *